United States Patent [19]
Jos

[11] Patent Number: 6,069,386
[45] Date of Patent: May 30, 2000

[54] SEMICONDUCTOR DEVICE

[75] Inventor: Hendrikus F. F. Jos, Nijmegen, Netherlands

[73] Assignee: U. S. Philips Corporation, New York, N.Y.

[21] Appl. No.: 09/062,946

[22] Filed: Apr. 20, 1998

[30] Foreign Application Priority Data

Apr. 28, 1997 [EP] European Pat. Off. .............. 97201272

[51] Int. Cl.$^7$ ........................... H01L 29/76; H01L 29/94; H01L 23/58
[52] U.S. Cl. ........................... 257/339; 257/343; 257/387
[58] Field of Search .................................. 257/343, 487, 257/491, 339, 335

[56] References Cited

U.S. PATENT DOCUMENTS

| | | | |
|---|---|---|---|
| 5,523,599 | 6/1996 | Fujishima et al. ...................... | 257/327 |
| 5,883,413 | 3/1999 | Ludikhuize ............................ | 257/343 |
| 5,910,670 | 6/1998 | Ludikhuize ............................ | 257/343 |

OTHER PUBLICATIONS

"High Performaance Silicon LDMOS Technology for 2GHz RF Power Amplifier Applications", Alan Wood et al, IEDM 96, pp. 87–90. 96, Primary Examiner—Donald L. Monin, Jr.
Attorney, Agent, or Firm—Brian J. Wieghaus

[57] ABSTRACT

A lateral DMOST with a drain extension 8 and a source contact entirely which overlaps the gate and thus forms a screen between the gate and the drain. The source contact 15 does not overlap the poly gate 9 but lies entirely laterally of this gate. The gate itself is provided with a low-ohmic metal contact strip 18, which results in a low gate resistance. A metal screening strip 20 is provided between this gate contact strip and the metal drain contact 16, which screening strip is connected to the source contact 15 next to the tips of the contact strip 18. Said screening strip leads to a major improvement in the power gain at high frequencies, for example in the RF range. The screening strip 20 may be realized together with the source, drain, and gate contacts in a common metal layer.

8 Claims, 2 Drawing Sheets

SEMICONDUCTOR DEVICE

BACKGROUND OF THE INVENTION

The invention relates to a semiconductor device comprising a semiconductor body which is provided with a lateral MOS transistor at a surface and which comprises a comparatively weakly doped region of a first conductivity type adjoining the surface and provided with a strongly doped source and drain zone of the opposed, second conductivity type, and with a weakly doped drain extension between the drain zone and a channel region which extends between the drain extension and the source zone, while a gate electrode is situated above the channel region and electrically insulated therefrom, an electrically insulating layer being laid over the surface and being provided with contact windows above the source and drain zones, through which contact windows the source zone and the drain zone are connected to a metal source contact and a drain contact, respectively.

Such transistors, which may be constructed both in discrete and in integrated form, are known, for example, from the article "High performance silicon LDMOS technology for 2 GHz RF power amplifier applications", by A. Wood et al., published in IEDM 96, pp. 87–90. The transistor is formed in a weakly doped p-type epitaxial layer on a strongly doped p-type substrate. The channel is defined in a p-type zone which is implanted into the epitaxial layer in a self-aligned manner with respect to the polycrystalline silicon gate electrode. The source and drain zones may have an interdigitated structure, the number of digits being chosen, for example, in dependence on the maximum electric current to be accommodated. The drain extension serves to increase the breakdown voltage between source and drain, as is generally known.

In this known transistor, the metal source contact overlaps the gate electrode and forms a screen between the drain contact and the gate electrode. The capacitance between the drain and the gate electrode is considerably reduced thereby, which leads inter alia to a major increase in the power gain at higher frequencies. A disadvantage of this overlapping source contact is that additional measures are to be taken for reducing the resistance of the gate electrode. The gate electrode in the known transistor is silicided for this purpose. Not only does this require additional process steps, but the resulting resistance of the silicided gate is still comparatively high, which in its turn leads to a lower power gain.

The invention has for its object inter alia to provide a transistor in which a lower gate resistance can be obtained than that which is possible with silicide, while a low gate-drain capacitance is retained, without additional process steps being necessary.

According to the invention, a semiconductor device of the kind described in the opening paragraph is for this purpose characterized in that the insulating layer is in addition provided with at least one contact window above the gate electrode, through which window the gate electrode is connected to a metal gate electrode contact, the contacts having the shape of parallel metal strips lying next to one another, and in that a further metal strip is provided which extends over the electrically insulating layer between the gate electrode contact strip and the drain contact strip and which is locally connected to the source contact strip, forming a screen between the gate electrode strip and the drain contact strip. Since the metal source contact is not provided above the gate electrode, the gate electrode can be provided with a metal connection over its entire length so that the gate resistance is determined by the layer resistance of the metal, and can accordingly be kept very low through the use of a well conducting metal. No additional process steps are necessary, moreover, because the metal contact of the gate electrode can be manufactured in the same metal layer as the source and drain contacts.

A simple embodiment of a semiconductor device according to the invention is characterized in that the screen strip is connected to the source contact strip adjacent an end face of the gate electrode contact strip.

The invention may be used to advantage in transistors (n-channel or p-channel) in which the channel is formed by a surface region of the semiconductor body. A preferred embodiment of a device according to the invention is characterized in that the transistor is of the lateral DMOS type.

These and other aspects of the invention will be explained in detail with reference to an embodiment. In the drawing:

Figure 1:
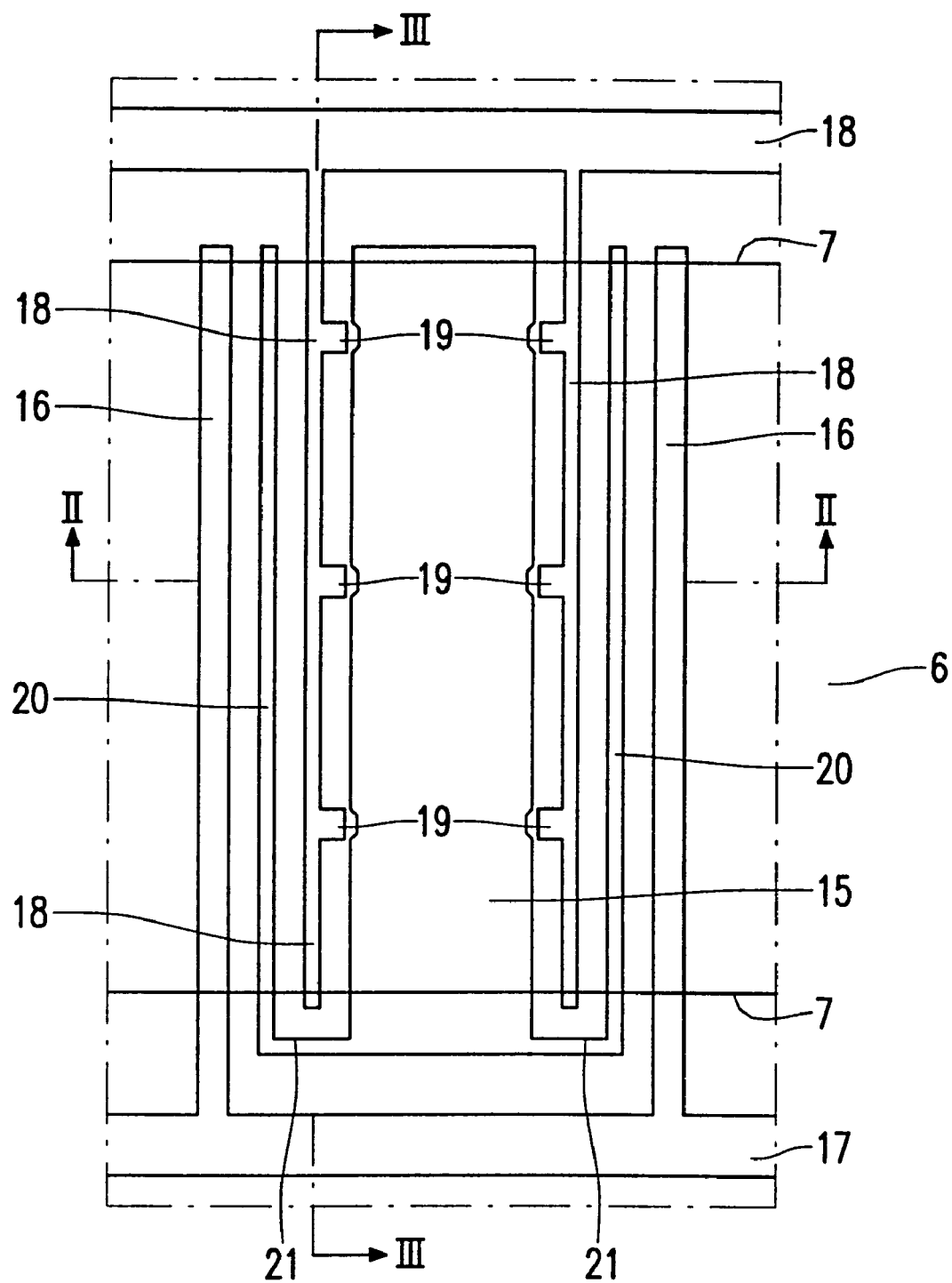
FIG. 1 is a plan view of a semiconductor device according to the invention.

It is noted that the drawing is merely diagrammatic and not drawn true to scale. It is further noted that the metallization pattern is mainly shown in FIG. 1. Parts which lie at a lower level have not been shown in FIG. 1, but only in the cross-sections of FIG. 2 and FIG. 3, for reasons of clarity.

DESCRIPTION OF THE PREFERRED EMBODIMENTS

Figure 2:
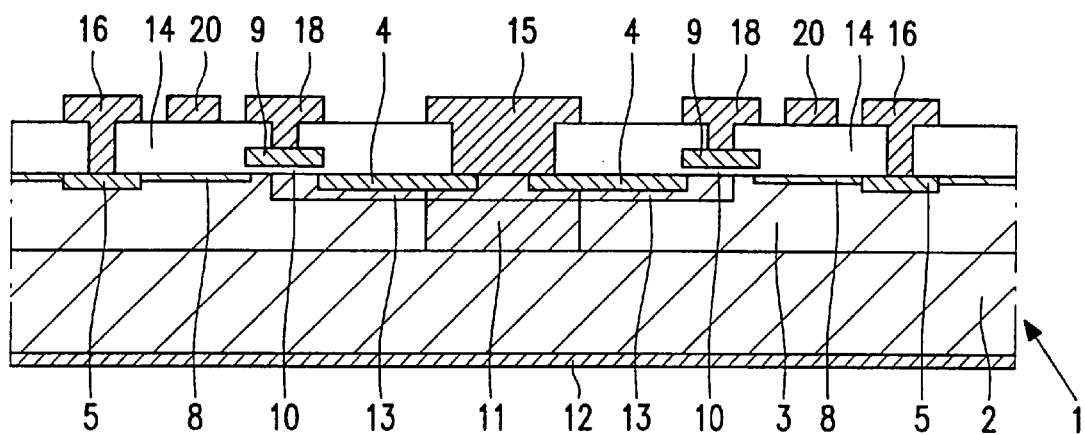
FIG. 2 is a cross-sectional view of this device taken on the line II—II.

The device comprises a semiconductor body 1 which in this example is made of silicon, but which may obviously also be made from an alternative suitable semiconductor material. The semiconductor body is built up from a low-ohmic, strongly doped, p-type substrate 2 and a comparatively weakly doped, high-ohmic region 3 which adjoins the surface of the silicon body and in which the transistor is accommodated. In this example, the region 3 is formed by a p-type epitaxial layer having a thickness of approximately 7 $\mu$m and a doping concentration of approximately $5*10^{15}$ atoms per $cm^3$. The doping concentration of the substrate 2 which acts as a connection for the source zone is high, for example between $10^{19}$ and $10^{20}$ atoms per $cm^3$. An active region 6 is defined in the epitaxial layer and is laterally bounded by thick field oxide 7. Source and drain zones of the transistor are provided in the active region in the form of strongly doped n-type surface zones 4 and 5, respectively. The transistor comprises a multi-digit structure with a number of source and drain digits situated next to one another, one source digit and two drain digits being shown in the Figure. The multi-digit structure may be obtained in a simple manner in that, for example, the portion shown in FIG. 1 and FIG. 2 is augmented to the left and to the right with a source zone, followed by a drain zone, and so on until the desired channel width is obtained. To increase the breakdown voltage, the drain zone 5 is provided with a high-ohmic n-type drain extension 8 between the drain zone 5 and the channel of the transistor. The length of the extension in this example is 3.5 $\mu$m. The transistor channel is formed by the p-type region between the extension 8 and the source zone 4. A gate electrode 9 is provided above the channel, separated from the channel by a gate oxide 10 with a thickness of, for example, 70 nm. The gate electrode 9 is formed by strips of strongly doped, approximately 0.8 μm thick polycrystalline silicon (poly) which, seen at the surface, extends transversely over the active region 6 between the source zones 4 and the drain extensions 8. The source zone (or zones) 4 is (or are) short-circuited with the p-type region via a deep, strongly doped p-type zone 11 which reaches from the surface down to the strongly doped substrate, and which connects the source zone 4 via the substrate 2 to the source electrode 12 at the lower side of the substrate. The transistor is constructed as a DMOST so that it can be operated at a sufficiently high voltage, for which purpose an additional p-type doping is provided in the channel in the form of the diffused p-type zone 13, so that the doping concentration is locally increased as compared with the weak epi doping.

The surface is coated with a thick glass layer 14 in which contact windows are provided above the source and drain zones, through which windows the source and drain zones are connected to metal source and drain electrodes 15 and 16, respectively. As is apparent from the plan view of FIG. 1, the contacts 15 and 16 are formed by metal strips which extend parallel to one another over the layer 14. The source contact 15 is not only connected to the source zone(s), but also to the deep p-type zone 11, and accordingly connects the source zone and the connection 12 with one another at the lower side of the substrate. The source zone may be connected to external connections or circuit elements via this connection. The source electrode strips 16 (FIG. 1) form a comb structure together with their basic or common portion 17 and may be connected via the common portion 17 to a bond pad elsewhere on the crystal.

Figure 3:
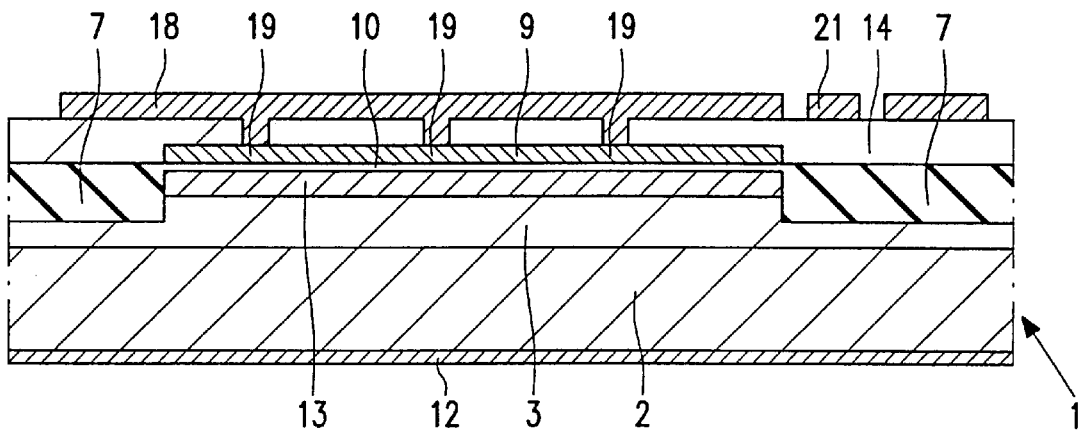
FIG. 3 is a cross-sectional view of this device taken on the line III—III.

According to the invention, the gate electrode 9 is also provided with a metal contact which extends in the form of a strip 18 over the oxide layer 14 between the metal strips 15 and 16 and which is locally connected to the gate 9 via a contact windows in the oxide layer 14. As FIG. 3 shows, the metal track 18 is not connected to the gate 9 over its entire length, but only in a number of interspaced locations 19 where the poly gate 9 is provided with widened portions suitable for connections. Provided the interspacings between the connections 19 are sufficiently small, the gate resistance is at least substantially fully determined by the resistance of the metal tracks 18. A very low gate resistance can be obtained through the use of a metal having a low resistivity, for example gold or aluminum. As is shown in FIG. 1, the Al track has a comb shape which forms an interdigitated structure together with the drain electrode 16, 17. Further metal tracks 20 are provided between the Al tracks 18 of the gate electrode and the Al tracks 16 of the drain contact, thus forming a capacitive screening between the gate 9, 18 and the drain electrode 16. The screening tracks 20 are connected to the Al electrode 15, and are connected via this electrode to the connection 12 of the source, beyond the tips of the Al tracks 18, by means of connections 21.

The invention is based inter alia on the recognition that the overlap capacitance between the gate electrode 9 and the drain zone 5 is negligibly small in practice owing to the comparatively long drain extension 8, and that the capacitance between gate and drain is mainly determined by the stray capacitance between the Al digits 16 and 18. This capacitance can be considerably reduced through the application of the screening electrode 20 between the digits 16 and 18. This leads to a major improvement, for example, in the power gain. Thus, for example, gain improvements from 2 to 2.5 dB at 2 GHz were measured in realized embodiments compared with devices without screening electrodes.

A very low gate resistance is obtained at the same time. In addition, the source electrode 15, the drain electrode 16, the gate electrode metallization 18, and the screening electrode 20 can be formed in a single metallization layer, so that complications in the production process are avoided.

It will be obvious that the invention is not limited to the embodiment described here but that many more variations are possible to those skilled in the art within the scope of the invention. Thus the invention may also be used to advantage in p-channel MOS transistors. The invention may be used not only in transistors of the DMOS type, but also in MOS transistors in which the channel is formed by a surface region of the epitaxial layer 3 instead of a diffused zone.

I claim:

1. A semiconductor device comprising:

a semiconductor body having a surface; a lateral MOS transistor at the surface of the semiconductor body, the lateral MOS transistor comprising a comparatively weakly doped region of a first conductivity type adjoining the surface, a strongly doped source and drain zone of the opposed, second conductivity type, a weakly doped drain extension between the drain zone and a channel region which extends between the drain extension and the source zone, and a gate electrode situated above the channel region and electrically insulated therefrom;

an electrically insulating layer over the surface of the semiconductor body and having contact windows above the source and drain zones, through which contact windows the source zone and the drain zone are connected to a metal source contact and a drain contact, respectively, the insulating layer having at least one contact window above the gate electrode, through which window the gate electrode is connected to a metal gate electrode contact, the contacts having the shape of parallel metal strips lying next to one another; and a further metal strip which extends over the electrically insulating layer between the gate electrode contact strip and the drain contact strip and which is locally connected to the source contact strip, forming a screen between the gate electrode strip and the drain contact strip.

2. A semiconductor device as claimed in claim 1, characterized in that the source contact strip, the drain contact strip, the gate electrode contact strip, and the screening strip are comprised by a common metal layer.

3. A semiconductor device as claimed in claim 2, characterized in that the screen strip is connected to the source contact strip adjacent an end face of the gate electrode contact strip.

4. A semiconductor device as claimed in claim 3, characterized in that the transistor is of the lateral DMOS type.

5. A semiconductor device as claimed in claim 2, characterized in that the transistor is of the lateral DMOS type.

6. A semiconductor device as claimed in claim 1, characterized in that the transistor is of the lateral DMOS type.

7. A semiconductor device as claimed in claim 1, characterized in that the screen strip is connected to the source contact strip adjacent an end face of the gate electrode contact strip.

8. A semiconductor device as claimed in claim 7, characterized in that the transistor is of the lateral DMOS type.

* * * * *